United States Patent
Aggarwal et al.

(10) Patent No.: US 10,608,172 B2
(45) Date of Patent: Mar. 31, 2020

(54) MAGNETORESISTIVE STRUCTURE HAVING TWO DIELECTRIC LAYERS, AND METHOD OF MANUFACTURING SAME

(71) Applicant: Everspin Technologies, Inc., Chandler, AZ (US)

(72) Inventors: Sanjeev Aggarwal, Scottsdale, AZ (US); Kerry Nagel, Scottsdale, AZ (US); Jason Janesky, Gilbert, AZ (US)

(73) Assignee: Everspin Technologies, Inc., Chandler, AZ (US)

(*) Notice: Subject to any disclaimer, the term of this patent is extended or adjusted under 35 U.S.C. 154(b) by 0 days.

(21) Appl. No.: 16/255,912

(22) Filed: Jan. 24, 2019

(65) Prior Publication Data

US 2019/0157550 A1    May 23, 2019

Related U.S. Application Data

(60) Continuation of application No. 15/856,202, filed on Dec. 28, 2017, now Pat. No. 10,230,046, which is a
(Continued)

(51) Int. Cl.
*H01L 43/12* (2006.01)
*H01L 43/02* (2006.01)
(Continued)

(52) U.S. Cl.
CPC ............ *H01L 43/12* (2013.01); *G11C 11/161* (2013.01); *H01L 43/02* (2013.01); *H01L 43/08* (2013.01); *H01L 43/10* (2013.01)

(58) Field of Classification Search
CPC .......... H01L 43/12; H01L 43/02; H01L 43/08; H01L 43/10
See application file for complete search history.

(56) References Cited

U.S. PATENT DOCUMENTS 6,806,546 B2   10/2004  Liu et al.
6,897,532 B1    5/2005  Schwarz et al.
(Continued)

OTHER PUBLICATIONS

International Search Report/Written Opinion, PCT/US20121058294, dated Feb. 7, 2013.
(Continued)

*Primary Examiner* — Matthew L Reames
(74) *Attorney, Agent, or Firm* — Bookoff McAndrews, PLLC

(57) ABSTRACT

A magnetoresistive structure having two dielectric layers, and method of manufacturing same, includes a free magnetic layer positioned between the two dielectric layers. The method of manufacture comprises at least two etch processes and at least one encapsulation process interposed therebetween wherein the encapsulation is formed on sidewalls of the partially formed magnetoresistive stack between etch processes. For example, an exemplary method of manufacturing a magnetoresistive device includes etching through a second electrode, second dielectric layer and free magnetic layer to provide a sidewall of (i) an unpinned synthetic antiferromagnetic structure, (ii) a second dielectric layer and (iii) a free magnetic layer; thereafter, forming an encapsulation material on the sidewall of the unpinned synthetic antiferromagnetic structure, second dielectric layer and free magnetic layer, and after forming the encapsulation material, etching through a first dielectric layer.

20 Claims, 6 Drawing Sheets

Related U.S. Application Data division of application No. 15/396,700, filed on Jan. 2, 2017, now Pat. No. 9,893,275, which is a division of application No. 14/797,172, filed on Jul. 12, 2015, now Pat. No. 9,548,442, which is a division of application No. 14/219,902, filed on Mar. 19, 2014, now Pat. No. 9,093,640, which is a division of application No. 13/250,361, filed on Sep. 30, 2011, now Pat. No. 8,685,756.

(51) Int. Cl.
*H01L 43/08* (2006.01)
*G11C 11/16* (2006.01)
*H01L 43/10* (2006.01)

(56) References Cited

U.S. PATENT DOCUMENTS

| | | |
|---|---|---|
| 6,985,384 B2 | 1/2006 | Costrini et al. |
| 7,122,854 B2 | 10/2006 | Fukuzumi |
| 7,936,027 B2 | 5/2011 | Xiao et al. |
| 8,119,424 B2 | 2/2012 | Mather et al. |
| 8,685,756 B2 | 4/2014 | Aggarwal et al. |
| 8,981,502 B2 | 3/2015 | Chen et al. |
| 9,093,640 B2 | 7/2015 | Aggarwal et al. |
| 9,548,442 B2 | 1/2017 | Aggarwal et al. |
| 9,893,275 B2 | 2/2018 | Aggarwal et al. |
| 2002/0146851 A1 | 10/2002 | Okazawa et al. |
| 2003/0184919 A1 | 10/2003 | Lin et al. |
| 2004/0063223 A1 | 4/2004 | Costrini et al. |
| 2005/0051820 A1 | 3/2005 | Stojakovic et al. |
| 2008/0265347 A1 | 10/2008 | Iwayama |
| 2010/0020592 A1 | 1/2010 | Hosatani et al. |
| 2010/0053823 A1 | 3/2010 | Iwayama |
| 2010/0178714 A1 | 7/2010 | Cho et al. |
| 2010/0311243 A1 | 12/2010 | Mao |
| 2018/0123032 A1 | 5/2018 | Aggarwal et al. |

OTHER PUBLICATIONS

EPO Examination Report, EP Application No. 12 778 548.3, dated Sep. 1, 2015, 5 pages.

Office Action, Chinese Application No. 201280057583.0, Chinese counterpart of PCT/US2012/058294, dated Mar. 4, 2016.

Extended Search Report, European Application No. 16191054.2, dated Feb. 24, 2017, 7 pages.

100

200

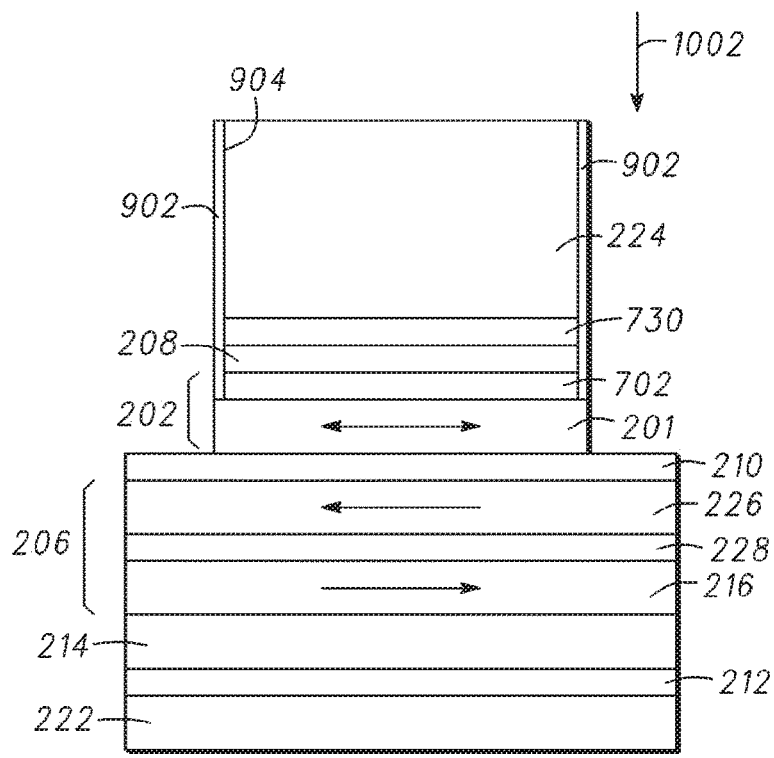

FIG. 10

IN A DUEL TUNNEL BARRIER MAGNETIC ELEMENT HAVING A FREE LAYER BETWEEN FIRST AND SECOND TUNNEL BARRIERS AND AN ELECTRODE OVER THE SECOND TUNNEL BARRIER, ETCHING AWAY A FIRST PORTION OF BOTH THE ELECTRODE AND THE SECOND TUNNEL BARRIER TO EXPOSE A FIRST PORTION OF THE FREE MAGNETIC LAYER, WHEREIN A SECOND PORTION OF THE SECOND ELECTRODE AND SECOND TUNNEL BARRIER OVER A SECOND PORTION OF THE FREE LAYER DEFINES A SIDEWALL — 1102

FORMING AN ENCAPSULATION MATERIAL ON THE SIDEWALL AND THE FIRST PORTION OF THE FREE LAYER — 1104

ETCHING AWAY THE FIRST PORTION OF THE FREE LAYER AND THE ENCAPSULATION MATERIAL THEREON — 1106

FIG. 11

MAGNETORESISTIVE STRUCTURE HAVING TWO DIELECTRIC LAYERS, AND METHOD OF MANUFACTURING SAME

RELATED APPLICATIONS

This application is a continuation application of U.S. patent application Ser. No. 15/856,202, filed Dec. 28, 2017, which is a divisional application of U.S. patent application Ser. No. 15/396,700, filed Jan. 2, 2017 (now U.S. Pat. No. 9,893,275), which is a divisional application of U.S. patent application Ser. No. 14/797,172, filed Jul. 12, 2015 (now U.S. Pat. No. 9,548,442), which is a divisional application of U.S. patent application Ser. No. 14/219,902, filed Mar. 19, 2014 (now U.S. Pat. No. 9,093,640), which is a divisional application of U.S. patent application Ser. No. 13/250,361, filed Sep. 30, 2011 (now U.S. Pat. No. 8,685,756).

TECHNICAL FIELD

The exemplary embodiments described herein generally relate to integrated magnetic devices and more particularly relate to magnetic sensors and magnetoresistive memories having double tunnel barriers.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field-switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The spin angular momentum carried by the spin-polarized tunneling current causes reversal of the free layer, with the final state (parallel or antiparallel) determined by the polarity of the current pulse. Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element. The mean current required to switch the magnetic state of the free layer is called the critical current (Ic). The critical current density (Jc) is the average critical current per area of the bit (Jc=Ic/A), where A is the area, and the current supplied by the circuit to switch spin-torque MRAM elements in a memory array is the write current (Iw). Reducing Iw is desirable so that a smaller access transistor can be used for each bit cell and a higher density, lower cost memory can be produced. Lowering Jc while not lowering the break down voltage, Vbd, where the tunnel barrier breaks down is desirable. Tunnel barrier breakdown is an irreversible degradation in the integrity of the tunnel barrier so that the magnetoresistance and spin torque reliability are greatly reduced.

Reducing the Ic by lowering the area of the bit for a constant Jc reduces the magnetic energy barrier Eb separating the two stable states of the free layer. Eb is proportional to the magnetization Ms of the free layer material, the anisotropy Hk of free layer, and the free layer volume V. Reducing the area obviously reduces V and therefore Eb. Reducing Eb impacts the non-volatility of the MRAM making it possible for the free layer to switch via thermal fluctuations in the temperature range and during the operating life of the part. It would be therefore be advantageous to reduce the area of the tunnel barrier without the reduction in area of the free layer.

In order to reduce write current, some spin-torque MRAM elements incorporate a dual-spin-filter (DSF) structure, in which the MTJ stack includes two different spin-polarizing layers, one on each side of the free layer, to lower Jc by improving spin-torque transfer efficiency through increased spin torque on the free layer, resulting in a lower write current. Dual-spin-filter devices have two tunnel barriers for providing a lower Jc, and a more symmetrical write current in the current up/down direction, than found in single tunnel barrier devices.

Dual-spin-filter devices require that the spin-polarizing fixed layers on either side of the free layer have opposite magnetization directions, so that the spin-torque effect from each of the two fixed layers will act together to switch the free layer magnetization into the desired direction when a current flows either up or down through the device.

Another structure similar to the DSF structure is a dual tunnel barrier structure (DTB). This structure, like the DSF, has tunnel barriers on either side of the free layer but, unlike the DSF, a magnetic fixed layer on only one side. This structure has shown an improvement in the ratio of the voltage required to write the bits and the voltage where breakdown occurs. This ratio provides more operating margin or voltage (or current Iw) and therefore is advantageous.

Accordingly, it is desirable to provide a spin-torque magnetoresistive memory element having symmetric tunnel barriers resulting in improved symmetry in the polarized current and switching states, the upper tunnel barrier undamaged by etching through the free layer. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A two step etch process allows for forming an encapsulation material on a sidewall of the electrode and the second tunnel barrier subsequent to the first etch for preventing damage to the first tunnel barrier when performing the second etch to remove a portion of the free layer to fabricate a magnetic device.

In a first exemplary embodiment, a method of manufacturing a magnetic element on a substrate, the magnetic element comprising forming a first electrode over the substrate; forming a first tunnel barrier over the first electrode; forming a free magnetic layer over the first tunnel barrier, forming a second tunnel barrier on the free magnetic layer, forming a second electrode over the second tunnel barrier; performing a first etch through a first portion of the second electrode and partially through a first portion of the second tunnel barrier to expose a surface of the second tunnel barrier defining a field; wherein the second portions of the second electrode and the second tunnel barrier define a sidewall; forming an encapsulation material on the sidewall and the field; and performing a second etch through the encapsulation material in the field and through the remaining portion of the first portion of the second tunnel barrier and a first portion of the free layer.

A second exemplary embodiment describes manufacturing a magnetic element on a substrate, the magnetic element comprising forming a first electrode over the substrate; forming a first tunnel barrier over the first electrode; forming a free magnetic layer over the first tunnel barrier; forming a second tunnel barrier on the free magnetic layer; forming a second electrode over the second tunnel barrier, performing a first etch through a first portion of the second electrode, through a first portion of the second tunnel barrier, and partially through a first portion of the free magnetic layer to expose a surface of the free magnetic layer defining a field; wherein the second portions of the second electrode, the second tunnel barrier, and the free magnetic layer define a sidewall; forming an encapsulation material on the sidewall and field; and performing a second etch through the encapsulation material in the field and through the remaining first portion of the free layer.

A third exemplary embodiment includes a magnetic element formed on a substrate, the substrate having a surface defining a plane, the magnetic element comprising a first electrode on the surface; a first tunnel barrier over the first electrode, the first electrode and the first tunnel barrier comprising first and second portions; a free magnetic layer over the first tunnel barrier overlying the second portion of the substrate and having a first dimension parallel to the plane; a second tunnel barrier over the free magnetic layer; a second electrode over the second tunnel barrier, the second tunnel barrier and the second electrode defining a sidewall; and an encapsulation material on the sidewall, wherein, the second electrode, and the second tunnel barrier have a second dimension parallel to the plane equal to or less than the first dimension.

BRIEF DESCRIPTION OF THE DRAWINGS

The present invention will hereinafter be described in conjunction with the following drawing figures, wherein like numerals denote like elements.

FIGS. 7-10 are cross sections of a process for manufacturing a spin-torque magnetoresistive memory element in accordance with another exemplary embodiment; and FIG. 11 is a flow chart in accordance with another exemplary embodiment of a process for manufacturing a spin-torque magnetoresistive memory element of FIGS. 7-9.

DETAILED DESCRIPTION

Figure 1:
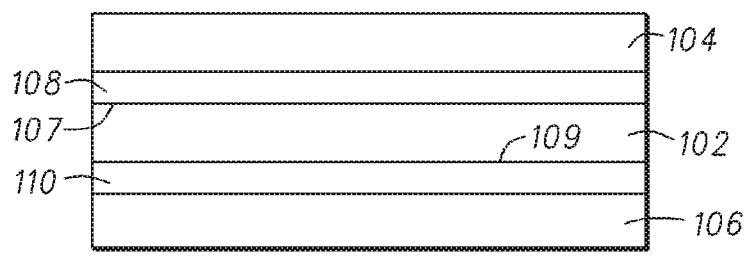
FIG. 1 is a cross section of a typical spin-torque magnetoresistive memory element.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

In general, a method and structure is described for manufacturing a magnetic device structure having double tunnel barriers. A free layer is positioned between the tunnel barriers and an electrode is over the upper, or second, tunnel barrier. A two-step etch process allows for forming an encapsulation material on a sidewall of the electrode and the second tunnel barrier subsequent to the first etch for preventing damage to the second (higher) tunnel barrier when performing the second etch to remove a portion of the free layer (and possibly, a portion of the free layer and some depth into the first tunnel barrier). The first etch removes a first portion of both the electrode and the second tunnel barrier, wherein a second portion of the second electrode and the second tunnel barrier over a second portion of the free magnetic layer defines a sidewall. An encapsulation material is formed on the sidewall and the first portion of the free magnetic layer. The second etch removes the first portion of the free magnetic layer and the encapsulation material thereon. The first etch reduces the level of current required to switch the free magnetic layer and the second etch defines the energy barrier of the free layer.

Independent control of the size of the two tunnel barriers is advantageous to optimize the various spin torque properties of the free layer; such as Ic, Eb and Vbd. Spin-torque devices depend on polarized electrons in a current to scatter in the free layer. By angular momentum conservation, the angular momentum from the once polarized then randomly oriented scattered electrons goes into the magnetization direction of the free layer causing it to re-orient. If there are significant asymmetries in the size of the tunnel barriers, there can be significant asymmetries in the polarized current, for example by having the current constrained such that it does not reach the edges of the free layer. Therefore, in addition, independent control of the size of each tunnel barrier would also provide independent control of the Ic for the two free layer states. The Eb however would be defined by the size of the free layer and the size of one tunnel barrier while the Ic would be influenced by the size of the other tunnel barrier. This would separate and control Eb and Ic. Additionally, both the dual spin filter and the dual tunnel barrier structures have an exposed upper tunnel barrier during the subsequent processing of the free layer. This free layer etching can cause uncontrolled damage to the upper tunnel barrier resulting in sub-optimal spin torque effects. Developing a process that independently controls and protects the upper tunnel barrier would therefore be advantageous.

During the course of this description, like numbers are used to identify like elements according to the different figures that illustrate the various exemplary embodiments.

The spin-torque effect is known to those skilled in the art. Briefly, a current becomes spin-polarized after the electrons pass through the first magnetic layer in a magnetic/non-magnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of the its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

FIG. 1 is a side sectional view of a dual tunnel barrier MRAM device 100 as disclosed in U.S. application Ser. No. 13/158,171 assigned to the assignee of this disclosure. In practice, an MRAM architecture or device will include many MRAM devices 100, typically organized in a matrix of columns and rows. The exemplary MRAM bit structure (or "stack") 100 generally includes a free magnetic layer (or "free layer") 102 separated from a top electrode 104 and a bottom electrode 106 by tunnel barriers 108 and 110, respectively. Either or both of the tunnel barriers 108 and 110 may be dielectrics, typically oxides such as MgO or AlOx. For the purposes of clarity, some commonly-used layers have not been illustrated in the drawings, including various protective cap layers, seed layers, and the underlying substrate (which may be a conventional semiconductor substrate or any other suitable structure). For the exemplary embodiments described below, the bottom electrode 106 is a ferromagnetic polarizer, while the top electrode 104 may be either a non-ferromagnetic material or a ferromagnetic polarizer. Alternatively, only the top electrode may be a ferromagnetic polarizer. Generally, a ferromagnetic polarizer would include a pinning layer, a pinned magnetic layer, a coupling spacer layer, and a fixed magnetic layer adjacent to the tunnel barrier (none of which are shown in FIG. 1) as is well known in the industry.

FIGS. 2-5 are side sectional views of an MRAM device 200 manufactured in accordance with an exemplary embodiment in which both electrodes are spin polarizers resulting in what may be referred to as a dual spin-filter MTJ (A non-spin-filter structure is described in FIGS. 7-10). The exemplary dual spin-filter MTJ bit structure (or "stack") 200 generally includes a free magnetic layer (or "free layer") 202 separated from a top electrode 204 and a bottom electrode 206 via tunnel barriers 208 and 210, respectively. Both of the layers 208 and 210 are dielectrics.

Bottom electrode 206 has a fixed magnetization state that does not change when the free layer 202 is switched between its two or more stable states. In the practical embodiment, bottom electrode 206 may include a template or seed layer 212 formed on a conductor 222 for facilitating the formation thereon of a pinning layer 214 made from an antiferromagnetic material, for example, IrMn, PtMn, or FeMn. The template/seed layer 212 is preferably a non magnetic material, for example Ta, TaN, Al, Ru, but can also be a magnetic material, for example NiFe or CoFe. The template/seed layer 212 may include two layers or may be omitted in cases where conductor 222 provides the desired growth characteristics for the subsequent layers. The bottom electrode 206 of device 200 includes three ferromagnetic layers 216, 226, and 220, antiferromagnetically coupled through coupling layers 228 and 213. The pinning layer 214 determines the orientation of a magnetic moment of the pinned ferromagnetic layer 216 formed thereon. Ferromagnetic layer 226 is antiferromagnetically coupled to pinned layer 216, through coupling layer 228, so that their magnetic moments orient antiparallel in the absence of an external field and fixed layer 220 is antiferromagnerically coupled to ferromagnetic layer 226, through coupling layer 213, so their magnetic moments orient antiparallel in the absence of an external field. The ferromagnetic layers 216, 226, and 220 may be formed from any suitable magnetic material, such as at least one of the elements Ni, Fe, Co, or their alloys including alloys incorporating additional elements such as B, C, Ta, V, Zr, and others, as well as so-called half-metallic ferromagnets such as NiMnSb, PtMnSb, $Fe_3O_4$, or $CrO_2$. In one embodiment, for example, pinned magnetic layer 216 and ferromagnetic layer 220 comprises 20-50 $\vec{A}$ of CoFe, fixed ferromagnetic layer 220 comprise about 20-30 $\vec{A}$ of CoFeB, and free magnetic layer 202 comprises about 20-35 $\vec{A}$ of CoFeB. Coupling layers 228 and 213 are formed from any suitable nonmagnetic material, including at least one of the elements Ru, Os, Re, Cr, Rh, Cu, Cr, or their combinations. Such synthetic antiferromagnet structures are known to those skilled in the art and, therefore, their operation will not be described in detail herein. Bottom electrode is chosen to be a synthetic antiferromagnet (SAF) with three ferromagnetic layers in device 200 while top electrode 204 is chosen to be a SAF with two ferromagnetic layers so that the magnetization direction of fixed layer 220 and the magnetization direction of top fixed layer 232 will be substantially antiparallel when processed under typical conditions for an MTJ stack as described below.

In these illustrations, arrows are used to indicate the direction of the magnetic moment, or magnetization, for individual layers. The magnetization directions of the top and bottom fixed layers 220 and 232 are typically set using a high-temperature anneal in a strong applied magnetic field. During the anneal, the ferromagnetic layers align with the strong magnetic field. When the field anneal is complete, the antiferromagnetic pinning material, such as that used in pinning layer 214, provides an exchange bias to the adjacent ferromagnetic pinned layer in the direction of the applied field.

Top electrode 204 includes a non-magnetic layer ("spacer layer," or "coupling layer") 230 between two ferromagnetic layers 232 and 234. The magnetic moments of ferromagnetic layers 232 and 234 are antiferromagnetically coupled through coupling layer 230, so that their magnetic moments orient antiparallel in the absence of an external field. A top pinning layer 244 can be used to orient the magnetic moment of ferromagnetic layer 234, in the same way that pinning layer 214 orients pinned layer 216. After the field anneal, the top pinned layer 234 and the bottom pinned layer 216 will be biased in the same direction by the pinning material. Since the SAF that forms the bottom electrode has one more ferromagnetic layer than does the top electrode, the magnetization of the bottom fixed layer 220 will be set in a direction antiparallel to the magnetization of the top fixed layer 232, providing the necessary magnetic configuration for additive contributions from both fixed layers to the spin torque transferred to the free layer 202.

Top electrode 204 is a SAF in that it comprises two ferromagnetic layers separated by a non-magnetic coupling layer, the thickness of the coupling layer chosen to provide strong antiferromagnetic coupling between the two ferromagnetic layers. The useful materials for the layers in top electrode 204 are the same as for bottom electrode 206. In one embodiment, for example, top pinned magnetic layer 234 comprises 20-30 Å of CoFe and ferromagnetic fixed layer 232 comprises about 20-30 Å of CoFeB.

It is desirable for the magnetic moments of fixed layers 220 and 232 to be relatively unaffected by spin-transfer torque from free layer 202, so that only the direction of the free layer 202 changes when a write current is applied. The fixed layers are made stable by the strong coupling between the layers in each SAF structure and the large magnetic volume of the SAFs compared to the free layer 202. The strong exchange coupling to the pinning material contributes additional stability in addition to defining a reference direction.

First and second conductor 222, 224 are formed from any suitable material capable of conducting electricity. For example, conductors 222, 224 may be formed from at least one of the elements Al, Cu, Ta, TaNx, Ti or their combinations. The various ferromagnetic layers may comprise any suitable material having the desired ferromagnetic properties as described above. It is advantageous to have the net magnetic coupling experienced by the free layer to be near zero so that the switching characteristics of the free layer are symmetric. This can be achieved by adjusting the thickness of each ferromagnetic layer in the top and bottom electrodes. There is typically a ferromagnetic coupling between a fixed layer and the free layer, due to various mechanisms known in the art. When both top and bottom fixed layers are present, and oriented in opposite directions as shown in device 200, the ferromagnetic interlayer coupling of one fixed layer opposes that of the other, reducing the net coupling. There is typically antiferromagnetic coupling between the layers in a patterned magnetic structure due to the poles that form at the patterned edges of the layers. Since the magnetization of each layer in a SAF structure is opposite to the nearest other ferromagnetic layer in SAF, they have a cancelling effect on each other. In a bottom electrode comprising a three-layer SAF as shown in device 200, the middle ferromagnetic layer 226 is typically designed to have a higher magnetic moment than ferromagnetic layers 216 and 220 so that the dipolar field created by layer 226 substantially cancels the dipolar fields created by layers 216 and 220. In an optimized structure, the layer thicknesses are adjusted so that all the sources of coupling experienced by the free layer sum to near zero.

In one embodiment, coupling layers 228, 213, 230 comprise Ru having a thickness of approximately 8 Å. In an alternate embodiment, some or all of the coupling layers may comprise a material, such as Ti or Ta, that does not produce any antiparallel coupling between continuous magnetic films, but merely causes exchange decoupling between the magnetic films. In this embodiment, the ferromagnetic SAF layers will be antiferromagnetically coupled due to the magnetostatic dipolar fields generated at the patterned edges of each layer. These alternate coupling layers will be useful for devices patterned to dimensions less than approximately 30 nm because this type of magnetostatic coupling is stronger for smaller patterned shapes.

Free magnetic layer 202 is formed from a ferromagnetic material having two or more stable magnetic states. For example, free magnetic element 202 may be formed of various ferromagnetic alloys comprising at least one of the elements Ni, Fe, and Co. Additional elements are added to the alloys to provide improved magnetic, electrical, or microstructural properties. As with conventional MRAM devices, the direction of the magnetization of free magnetic element 202 determines the resistance of the element. In practice, for a two-state device, the direction of the magnetization of free magnetic element 202 is either parallel or anti-parallel to the magnetization of a fixed magnetic layer, resulting in a low or high resistance representing a "0" bit state or a "1" bit state. Furthermore, the free magnetic element 202 may have an in-plane magnetization while the ferromagnetic spin polarizer has out-of-plane magnetization.

Free magnetic layer 202 has a magnetic easy axis that defines a natural or "default" axis of its magnetization. When MRAM device 200 is in a steady state condition with no current applied from conductor 222 to conductor 224, the magnetization of free magnetic element 202 will naturally point along its easy axis. MRAM device 200 is suitably configured to establish a particular easy axis direction for free magnetic element 202. From the perspective of FIG. 2, the easy axis of free magnetic element 202 points either to the right or to the left. In practice, MRAM device 200 utilizes anisotropy, such as shape, crystalline, or interface anisotropy, in the free magnetic layer 202 to achieve the orientation of the respective easy axes. It is understood by those skilled in the art that some materials have a strong perpendicular anisotropy which can be used to make free layers with the two magnetic states lying along a perpendicular easy axis so the two magnetic states are up and down in FIG. 2. For such devices, one or more perpendicular fixed layer is also used.

In addition to carrying the write current, conductors 222 and 224 also serve as the data read conductors for MRAM device 200. In this regard, data in MRAM device 200 can be read in accordance with conventional techniques: a small current flows through MRAM device 200 and electrode 224, and that current is measured to determine whether the resistance of MRAM device 200 is relatively high or relatively low. The read current is much smaller than the current required to switch the free layer by spin-torque in order to avoid disturbs caused by reading the cell.

Figure 2:
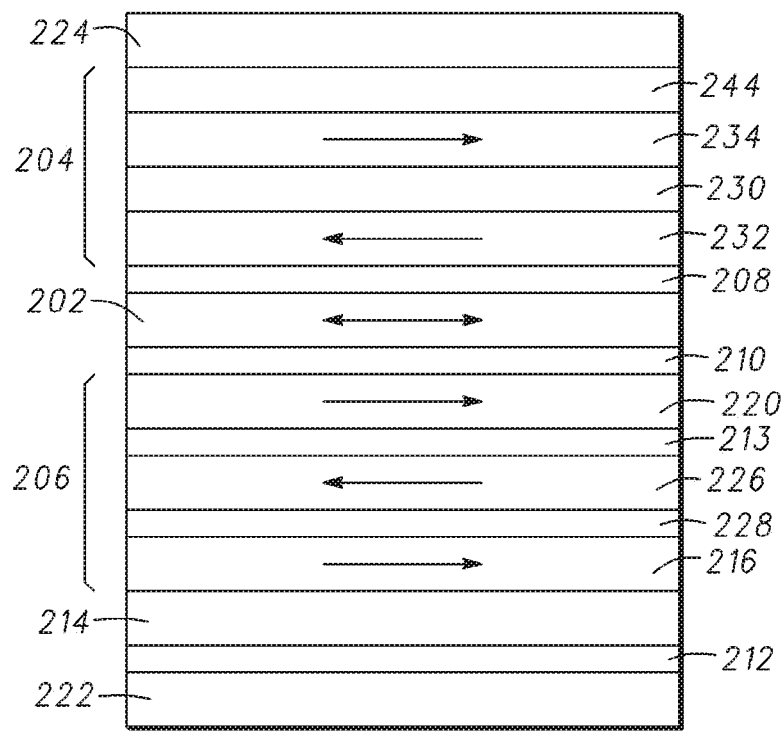
FIGS. 2-5 are cross sections of a process for manufacturing a spin-torque magnetoresistive memory element in accordance with an exemplary embodiment.

In practice, MRAM device 200 may employ alternative and/or additional elements, and one or more of the elements depicted in FIG. 2 may be realized as a composite structure or combination of sub-elements. The specific arrangement of layers shown in FIG. 2 merely represents one suitable embodiment of the invention.

During fabrication of MRAM structure 200, each succeeding layer (i.e., layers 222, 212, 214, 216, 228, 226, 213, 220, 210, 202, 208, 232, 230, 234, 244, 224) is deposited or otherwise formed in sequence and each MRAM bit is defined by selective deposition, photolithography processing, and etching in accordance with any of the various conventional techniques known in the semiconductor industry. During deposition of the various fixed and free magnet layers, a magnetic field may be provided to set a preferred easy magnetic axis of the layer (i.e., via induced anisotropy). Similarly, a strong magnetic field applied during the post-deposition high-temperature anneal step may be used to induce a preferred easy axis and a preferred pinning direction for any antiferromagnetically pinned materials.

In forming the MRAM bit, it is desired to etch down through layers 224, 244, 234, 230, 232, 208 and 202 to reach the lower tunnel barrier 210; however, the etching material used to etch through the free layer 202 may oxidize or damage the edges of the upper tunnel barrier 208. In order to protect the upper tunnel barrier, and in accordance with the first exemplary embodiment, an etch-encapsulation-etch process is used.

Figure 3:
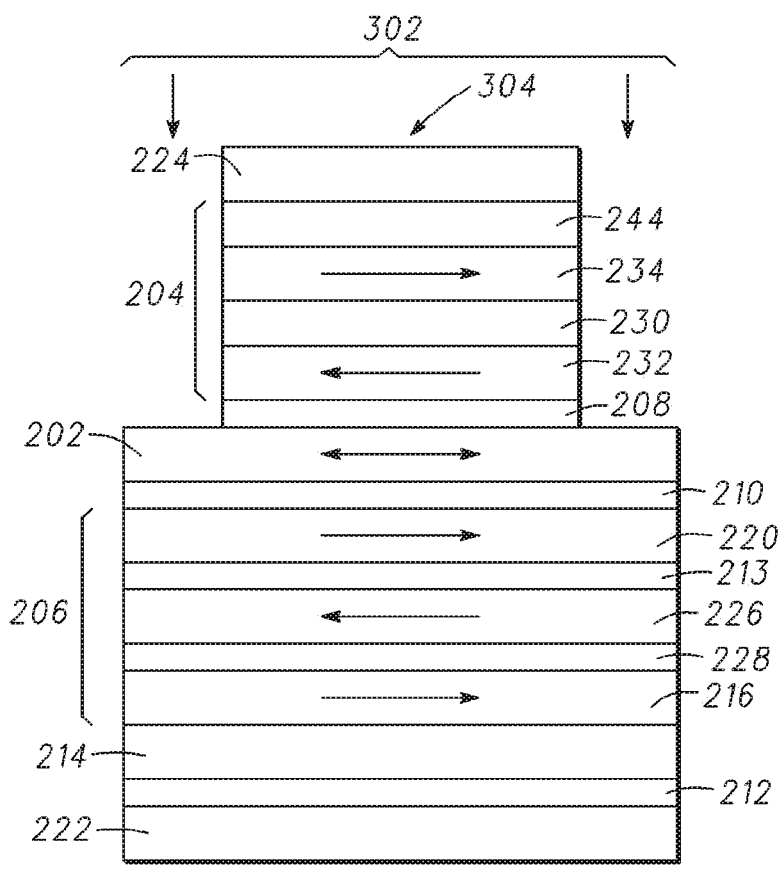
Figure 4:
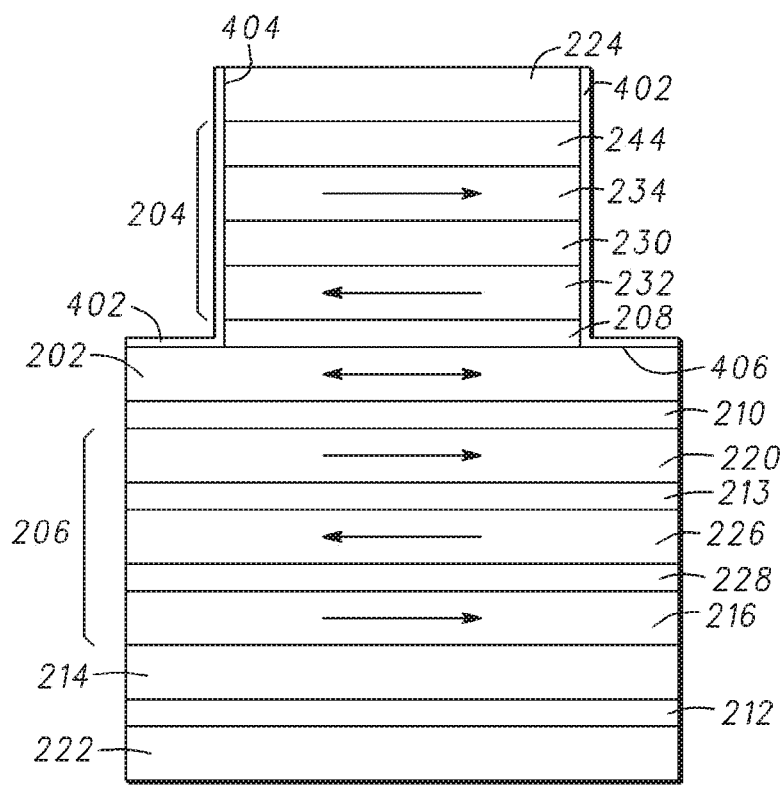
Figure 5:
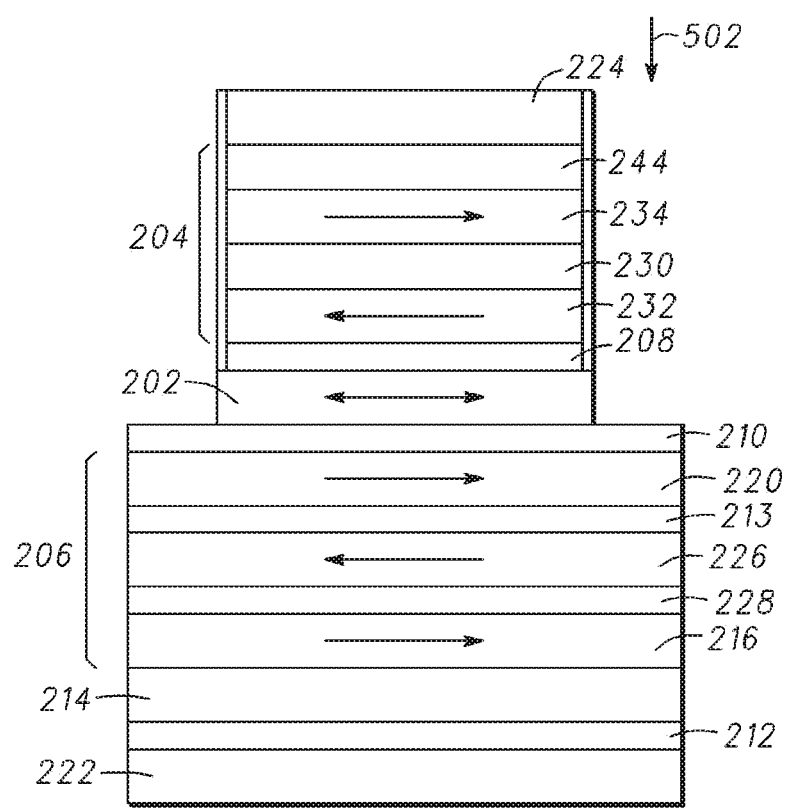

Referring to FIG. 3, an etching chemistry 302 etches through layers 224, 244, 234, 230, 232, 208 creating an MRAM bit 304. This etching is halted, for example, by tracking a Magnesium trace in the etch chemistry, at the free layer. An encapsulation material 402 (FIG. 4) is deposited on a sidewall 404 of the layers 224, 244, 234, 230, 232, 208, and optionally on a surface 406 (which may be referred to as a field) of the free layer 202. The encapsulation material may be aluminum, silicon nitride, silicon oxide, or magnesium, for example. The encapsulation material may be subsequently oxidized.

A second etch is performed (FIG. 5) in a vertical direction 502 to etch away the encapsulation material 402 from the surface 406 of the free layer 202 and etch away the free layer 202, to expose the lower tunnel barrier 210. The encapsulation material 402 on the sidewall 404 protects the upper tunnel barrier 208 from damage during the second etch. Additionally, the cross sectional area of upper tunnel barrier 208 can be controlled with respect to the lower tunnel barrier 210 by controlling the thickness of the encapsulation layer 402 and 404. Preferably, the lower tunnel barrier has a cross sectional area greater than one and less than five times that of the upper tunnel barrier.

Figure 6:
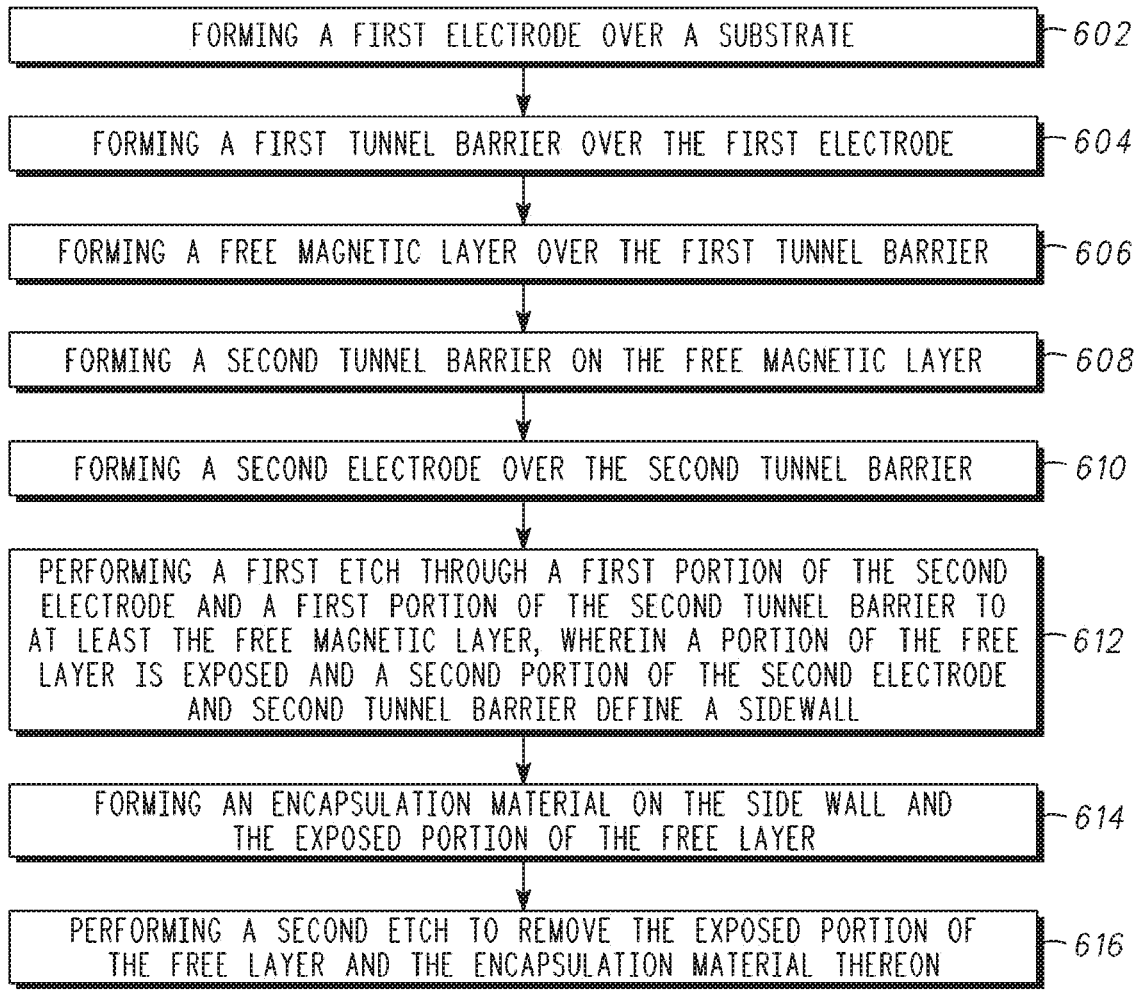
FIG. 6 is a flow chart in accordance with an exemplary embodiment of a process for manufacturing the spin-torque magnetoresistive memory element of FIGS. 3-5.

Referring to FIG. 6, the method 600 for manufacturing magnetic devices having double tunnel barriers comprises forming 602 a first electrode over a substrate, forming 604 a first tunnel barrier over the first electrode, forming 606 a free magnetic layer over the first tunnel barrier, forming 608 a second tunnel barrier on the free magnetic layer, forming 610 a second electrode over the second tunnel barrier, performing 612 a first etch through a first portion of the second electrode and a first portion of the second tunnel barrier to at least the free magnetic layer (the free magnetic layer may also be partially or completely etched), wherein a second portion of the second electrode and second tunnel barrier define a sidewall, forming 614 an encapsulation material on the sidewall, and performing 616 a second etch to remove the exposed portion of the free layer and the encapsulation material thereon.

It is known in the art, for example U.S. Pat. No. 7,605,437, that there can be advantages to eliminating the top pinning layer 244 and instead designing electrode 204 to work as an "unpinned" SAF. The magnetic orientation of the unpinned SAF can be set by designing a magnetic asymmetry into the structure, such as a moment imbalance between the ferromagnetic layers of the SAF 232 and 234. While the dual spin filter device of FIG. 5 has a symmetric structure with spin torque and heating effects from both tunnel barrier layers 208, 210, the dual tunnel barrier device described below (FIGS. 7-10) has an asymmetric structure with a spin torque effect from only one tunnel barrier layer and heating effects from both tunnel barrier layers.

Figure 7:
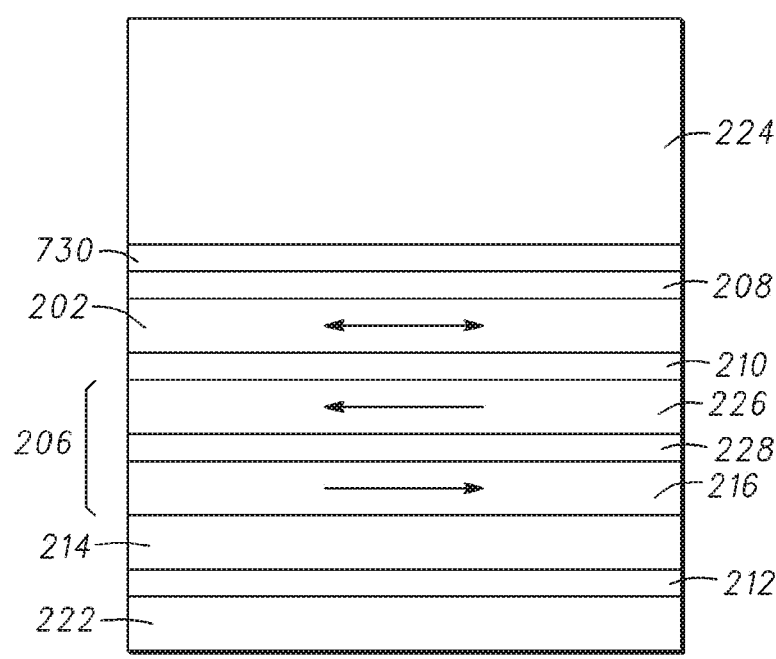

FIG. 7 is a side sectional view of an MRAM device 700 of another exemplary embodiment in which the tunnel barrier 208 and below, including layers 222, 212, 214, 216, 228, 226, 210, 202 are similar to those as described in the previous embodiment of FIGS. 2-5 (a DTB structure typically will have only two magnetic layers, resulting in layers 213 and 220 being removed from the electrode 206 as shown in the previously described embodiment). In accordance with this embodiment 700, a non-ferromagnetic layer 730 is formed on the tunnel barrier 208 and a conductor 224 is formed over the non-ferromagnetic layer 730. This double-tunnel-barrier structure is not a dual spin filter since it has a ferromagnetic layer polarizing the tunneling electrons on one side only. However, it is found that the top tunnel junction formed by tunnel barrier 208 enables a significant reduction in the critical current Ic required to switch the free layer, even though top electrode 730 is not ferromagnetic. The improvement may arise from magnetic heating of the free layer by the electrons tunneling through tunnel barrier 208 and from perpendicular interface anisotropy resulting from the interface between the surface of the free layer 202 and the top tunnel barrier 208. Since top electrode 730 is not ferromagnetic, the magnetoresistance (MR) for the junction formed by tunnel barrier 208 is zero and this junction will be the non-dominant junction in the double-tunnel-barrier device. The double-barrier structure 700 is useful because it provides many of the benefits of the dual spin filter structures 200, but with a simpler and thinner top electrode, making the material stack much easier to pattern into devices. As in known to those in the industry, alternatively in another exemplary embodiment, the bottom electrode 206 may be above the tunnel barrier 208 while the non-ferromagnetic layer 730 would be positioned below tunnel barrier 210.

In forming the MRAM bit 804 (FIG. 8), it is desired to etch down through layers 224, 730, 702 to reach the lower tunnel barrier 210; however, the etching material used to etch through the free layer 202 may oxidize or damage the edges of the upper tunnel barrier 208. In order to protect the upper tunnel barrier, and in accordance with the first exemplary embodiment, an etch-encapsulation-etch process is used.

Figure 8:
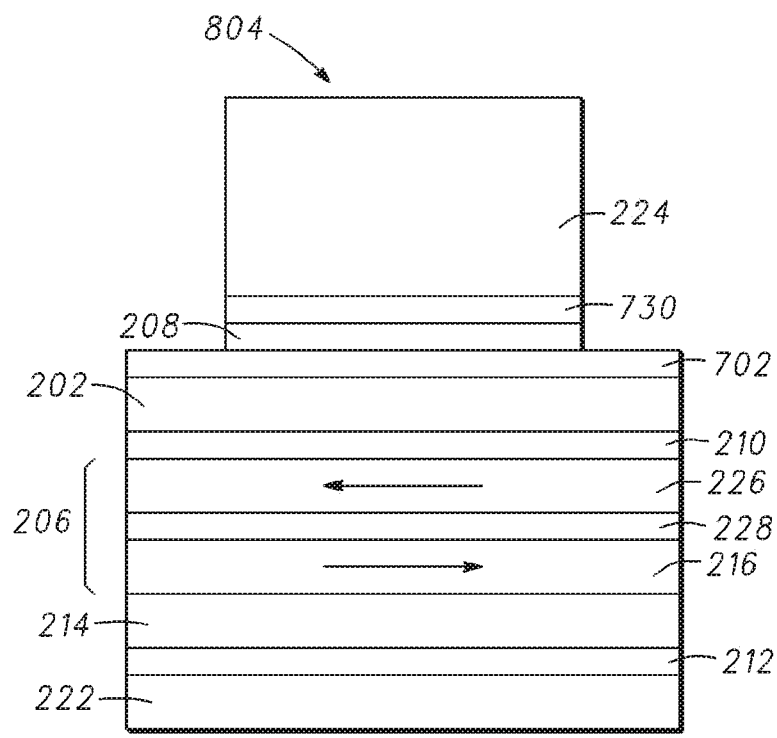
Figure 9:
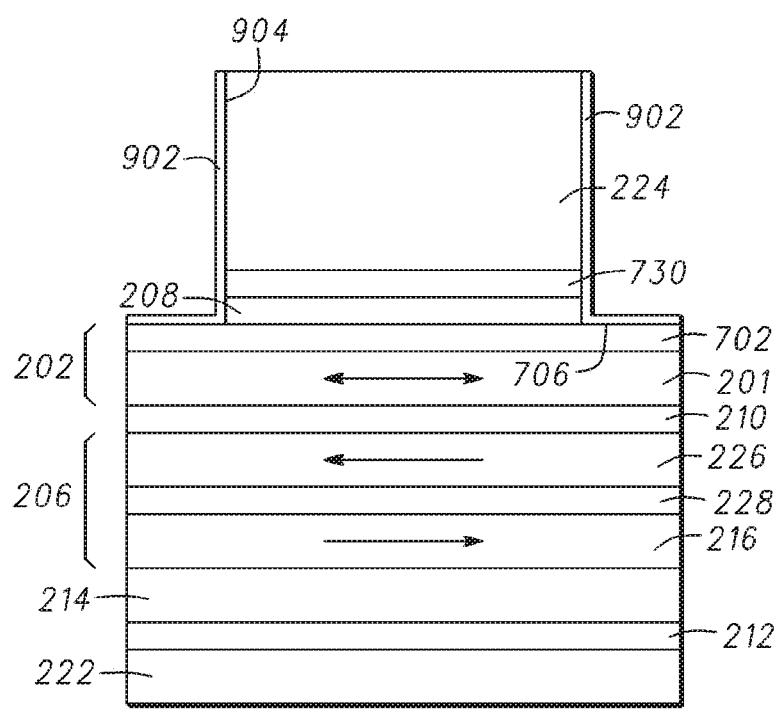

Referring to FIG. 8 an etching chemistry 302 etches through layers 224, 730 creating an MRAM bit 804. This etching is halted, for example, by tracking a Magnesium trace in the etch chemistry, at the free layer. An encapsulation material 902 (FIG. 9) is deposited on a sidewall 904 of the layers 224, 730, and on a surface 706 (which may be referred to as a field) of the free layer 202. The encapsulation material may be Silicon Nitride or Magnesium, for example, but preferably is Aluminum. The encapsulation material may be subsequently oxidized.

A second etch is performed (FIG. 10) in a vertical direction 1002 to etch away the encapsulation material 902 from the surface 706 of the free layer 202 and etch away the free layer 202, to expose the lower tunnel barrier 210. Alternatively, this second etch need not stop exactly at the lower tunnel barrier 210, may etch none, some or all of the lower tunnel barrier 210. The second etch chemistry preferably is more selective and will not punch through the lower tunnel barrier (the etching slows down). The encapsulation material 902 on the sidewall 904 protects the upper tunnel barrier 208 from damage during the second etch.

It may be desired to have the cross-sectional area of the two tunnel barriers 210, 208 to be the same, i.e., have symmetry, in order to prevent asymmetries in the polarized current. Aluminum is preferred as the encapsulation material 402 because the thickness of Aluminum required is less. Therefore, the cross-sectional area of the upper tunnel barrier 208, while slightly smaller, is sufficiently close to the cross-section area of the lower tunnel barrier 210. Alternatively, the choice of the encapsulation material 402 and deposition conditions controls the relative size of the two tunnel barriers 208, 210. The results may be selected by the choice of encapsulation material 402 and thickness.

FIG. 11 is a flow chart that illustrates an exemplary embodiment of a process 1100 for fabricating an MRAM device having a high magnetoresistance and a low critical current density. It should be appreciated that process 1100 may include any number of additional or alternative tasks, the tasks shown in FIG. 11 need not be performed in the illustrated order, and process 1100 may be incorporated into a more comprehensive procedure or process having additional functionality not described in detail herein. Moreover, one or more of the tasks shown in FIG. 11 could be omitted from an embodiment of the process 1000 as long as the intended overall functionality remains intact.

The method 1100 for forming a dual tunnel barrier magnetic element having a free layer between first and second tunnel barriers and an electrode over the second tunnel barrier, comprises etching 1102 through a first portion of both the electrode and the second tunnel barrier to the free magnetic layer to expose a first portion of the free layer, wherein a second portion of the second electrode and second tunnel barrier over a second portion of the free layer, defines a sidewall, forming 1104 an encapsulation material on the sidewall and the first portion of the free layer, and etching 1106 away the first portion of the free layer and the encapsulation material thereon.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of manufacturing a magnetoresistive device from a stack including (i) a first electrode disposed over a substrate, (ii) a first dielectric layer configured to form a first tunnel barrier of the magnetoresistive device disposed over the first electrode, (iii) a free magnetic layer disposed over the first dielectric layer, (iv) a second dielectric layer configured to form a second tunnel barrier of the magnetoresistive device disposed over the free magnetic layer, and (v) a third electrode disposed over the second dielectric layer, wherein the first electrode forms a fixed magnetic region of the magnetoresistive device, the method comprising:
    (a) etching through the third electrode and the second dielectric layer to expose a surface of the free magnetic layer and form sidewalls on the third electrode and the second dielectric layer;
    (b) after step (a), forming an encapsulation layer on (i) the sidewalls of the third electrode and the second dielectric layer and (ii) the exposed surface of the free magnetic layer; and
    (c) after step (b), etching (i) through the encapsulation layer on the exposed surface of the free magnetic layer and (ii) the exposed surface of the free magnetic layer.

2. The method of claim 1, wherein forming an encapsulation layer in step (b) includes depositing one of aluminum, silicon nitride, silicon oxide, or magnesium.

3. The method of claim 1, wherein forming an encapsulation layer in step (b) includes depositing an encapsulating material and oxidizing the deposited encapsulating material.

4. The method of claim 1, wherein the first electrode and the third electrode are both synthetic antiferromagnetic structures.

5. The method of claim 1, wherein the third electrode forms a second fixed magnetic region of the magnetoresistive device.

6. The method of claim 1, wherein the third electrode includes a non-ferromagnetic material.

7. The method of claim 1, wherein the third electrode includes a layer of conductive material formed over a layer of non-ferromagnetic material.

8. The method of claim 1, wherein the etching in step (c) includes etching through the free magnetic layer to expose a surface of the first dielectric layer.

9. The method of claim 1, wherein the stack includes a conductor layer disposed over the third electrode, and the etching in step (a) includes etching through the conductor layer.

10. The method of claim 1, wherein first and second dielectric layer includes one of magnesium oxide or aluminum oxide.

11. A method of manufacturing a magnetoresistive device from a stack including (i) a first electrode disposed over a substrate, (ii) a first dielectric layer configured to form a first tunnel barrier of the magnetoresistive device disposed over the first electrode, (iii) a free magnetic layer disposed over the first dielectric layer, (iv) a second dielectric layer configured to form a second tunnel barrier of the magnetoresistive device disposed over the free magnetic layer, and (v) a third electrode disposed over the second dielectric layer, wherein the first electrode forms a fixed magnetic region of the magnetoresistive device, the method comprising:
  (a) etching through a first portion of the stack to form sidewalls on the first portion and expose a surface of a second portion of the stack positioned below the first portion;
  (b) after step (a), forming an encapsulation layer on (i) the sidewalls of the first portion and (ii) the exposed surface of the second portion; and
  (c) after step (b), etching (i) through the encapsulation layer on the exposed surface of the second portion and (ii) the exposed surface of the second portion.

12. The method of claim 11, wherein the first portion includes at least the third electrode.

13. The method of claim 12, wherein the second portion includes at least the second dielectric layer.

14. The method of claim 11, wherein forming an encapsulation layer in step (b) includes depositing one of aluminum, silicon nitride, silicon oxide, or magnesium.

15. The method of claim 11, wherein forming an encapsulation layer in step (b) includes depositing an encapsulating material and oxidizing the deposited encapsulating material.

16. The method of claim 11, wherein the first electrode and the third electrode are both synthetic antiferromagnetic structures.

17. The method of claim 11, wherein the third electrode forms a second fixed magnetic region of the magnetoresistive device.

18. The method of claim 11, wherein the third electrode includes a non-ferromagnetic material.

19. The method of claim 11, wherein the third electrode includes a layer of conductive material formed over a layer of non-ferromagnetic material.

20. The method of claim 11, wherein the etching in step (c) includes etching through the second portion.

* * * * *